United States Patent
Huang et al.

(10) Patent No.: US 11,362,337 B2
(45) Date of Patent: *Jun. 14, 2022

(54) ELECTRODEPOSITED COPPER FOIL AND ELECTRODE, AND LITHIUM-ION SECONDARY BATTERY COMPRISING THE SAME

(71) Applicant: CHANG CHUN PETROCHEMICAL CO., LTD., Taipei (TW)

(72) Inventors: Huei-Fang Huang, Taipei (TW); Chih-Chung Wu, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/260,405

(22) PCT Filed: Jan. 15, 2020

(86) PCT No.: PCT/CN2020/072157
§ 371 (c)(1),
(2) Date: Jan. 14, 2021

(87) PCT Pub. No.: WO2020/156158
PCT Pub. Date: Aug. 6, 2020

(65) Prior Publication Data
US 2021/0305580 A1   Sep. 30, 2021

Related U.S. Application Data

(63) Continuation of application No. 16/584,157, filed on Sep. 26, 2019, now Pat. No. 10,622,637.
(Continued)

(51) Int. Cl.
*B32B 15/00* (2006.01)
*H01M 4/66* (2006.01)
(Continued)

(52) U.S. Cl.
CPC .............. *H01M 4/661* (2013.01); *B32B 15/01* (2013.01); *B32B 15/08* (2013.01); *B32B 15/20* (2013.01);
(Continued)

(58) Field of Classification Search
None
See application file for complete search history.

(56) References Cited

U.S. PATENT DOCUMENTS 9,899,683 B2   2/2018   Lee et al.
10,205,170 B1  2/2019   Huang et al.
(Continued)

FOREIGN PATENT DOCUMENTS

CN   1543292 A   11/2004
CN   2752274 Y    1/2006
(Continued)

OTHER PUBLICATIONS

US Patent Office, Office Action dated Oct. 13, 2021(U.S. Appl. No. 17/259,333).
(Continued)

*Primary Examiner* — Seth Dumbris
(74) *Attorney, Agent, or Firm* — WPAT, PC

(57) ABSTRACT

Provided are an electrodeposited copper foil, an electrode comprising the same, and a lithium-ion secondary battery comprising the same. The electrodeposited copper foil has a drum side and a deposited side opposing the drum side, wherein at least one of the drum side and the deposited side exhibits a void volume value (Vv) in the range of 0.17 $\mu m^3/\mu m^2$ to 1.17 $\mu m^3/\mu m^2$; and an absolute value of a
(Continued)

difference between a maximum height (Sz) of the drum side and a Sz of the deposited side is in the range of less than 0.60 µm.

18 Claims, 2 Drawing Sheets

Related U.S. Application Data

(60) Provisional application No. 62/800,263, filed on Feb. 1, 2019.

(51) Int. Cl.

| | | |
|---|---|---|
| H01M 4/04 | (2006.01) | |
| H01M 10/0525 | (2010.01) | |
| C25D 1/04 | (2006.01) | |
| H01M 4/70 | (2006.01) | |
| B32B 15/01 | (2006.01) | |
| B32B 15/08 | (2006.01) | |
| B32B 15/20 | (2006.01) | |
| C25D 3/04 | (2006.01) | |
| C25D 3/12 | (2006.01) | |
| C25D 3/22 | (2006.01) | |
| C25D 3/38 | (2006.01) | |
| C25D 5/14 | (2006.01) | |
| C25D 5/16 | (2006.01) | |
| C25D 5/48 | (2006.01) | |
| H05K 1/09 | (2006.01) | |
| H05K 1/18 | (2006.01) | |
| H05K 3/38 | (2006.01) | |
| C25D 5/10 | (2006.01) | |
| H05K 1/02 | (2006.01) | |
| H01M 4/02 | (2006.01) | |

(52) U.S. Cl.
CPC ............. *C25D 1/04* (2013.01); *C25D 3/04* (2013.01); *C25D 3/12* (2013.01); *C25D 3/22* (2013.01); *C25D 3/38* (2013.01); *C25D 5/10* (2013.01); *C25D 5/14* (2013.01); *C25D 5/16* (2013.01); *C25D 5/48* (2013.01); *H01M 4/0469* (2013.01); *H01M 4/70* (2013.01); *H01M 10/0525* (2013.01); *H05K 1/0242* (2013.01); *H05K 1/09* (2013.01); *H05K 1/18* (2013.01); *H05K 1/181* (2013.01); *H05K 3/384* (2013.01); *H05K 3/389* (2013.01); *B32B 2255/06* (2013.01); *B32B 2255/205* (2013.01); *B32B 2255/28* (2013.01); *B32B 2307/202* (2013.01); *B32B 2457/08* (2013.01); *H01M 2004/027* (2013.01); *H05K 2201/0338* (2013.01); *H05K 2201/0355* (2013.01); *H05K 2201/0373* (2013.01); *H05K 2201/10522* (2013.01); *H05K 2201/2054* (2013.01); *H05K 2203/0307* (2013.01); *Y10T 428/12431* (2015.01)

(56) References Cited

U.S. PATENT DOCUMENTS

| | | | |
|---|---|---|---|
| 10,424,793 | B2 | 9/2019 | Cheng et al. |
| 10,581,081 | B1 | 3/2020 | Huang et al. |
| 10,622,637 | B1* | 4/2020 | Huang ............... H05K 1/0242 |
| 2004/0029006 | A1 | 2/2004 | Otsuka et al. |
| 2006/0210823 | A1 | 9/2006 | Sano et al. |
| 2008/0280159 | A1 | 11/2008 | Iwakiri et al. |
| 2010/0040951 | A1 | 2/2010 | Yamamoto |
| 2011/0127074 | A1 | 6/2011 | Takahashi |
| 2011/0223455 | A1 | 9/2011 | Kimura et al. |
| 2012/0111733 | A1 | 5/2012 | Tsai et al. |
| 2013/0011690 | A1 | 1/2013 | Arai et al. |
| 2013/0040162 | A1 | 2/2013 | Fujisawa et al. |
| 2014/0193660 | A1* | 7/2014 | Tsai ....................... C25D 1/04 428/606 |
| 2014/0264417 | A1 | 9/2014 | Kobayashi et al. |
| 2016/0120017 | A1* | 4/2016 | Momoi ................. B32B 27/36 361/720 |
| 2017/0042036 | A1 | 2/2017 | Miyamoto |
| 2017/0320247 | A1 | 11/2017 | Aizawa et al. |
| 2018/0083309 | A1 | 3/2018 | Ho et al. |
| 2018/0210364 | A1* | 7/2018 | Imase ............... G03G 15/0233 |
| 2018/0245230 | A1 | 8/2018 | Sonoda et al. |
| 2018/0279482 | A1 | 9/2018 | Ishii et al. |
| 2018/0282890 | A1 | 10/2018 | Chun et al. |
| 2018/0288884 | A1* | 10/2018 | Ori ....................... B32B 27/36 |
| 2019/0145014 | A1 | 5/2019 | Chen et al. |
| 2019/0249322 | A1 | 8/2019 | Lee et al. |
| 2020/0096886 | A1 | 3/2020 | Sasaki et al. |
| 2020/0248328 | A1* | 8/2020 | Huang .................. H05K 1/181 |
| 2020/0248330 | A1* | 8/2020 | Lai ....................... C25D 3/38 |
| 2020/0253047 | A1* | 8/2020 | Lai ....................... C25D 5/10 |
| 2020/0253061 | A1* | 8/2020 | Huang .................. H05K 3/384 |

FOREIGN PATENT DOCUMENTS

| | | | |
|---|---|---|---|
| CN | 1788111 | A | 6/2006 |
| CN | 1809764 | A | 7/2006 |
| CN | 1995469 | A | 7/2007 |
| CN | 101098005 | A | 1/2008 |
| CN | 101302635 | A | 11/2008 |
| CN | 101669237 | A | 3/2010 |
| CN | 102203326 | A | 9/2011 |
| CN | 102234823 | A | 11/2011 |
| CN | 102418129 | A | 4/2012 |
| CN | 102965698 | A | 3/2013 |
| CN | 103392028 | A | 11/2013 |
| CN | 103493253 | A | 1/2014 |
| CN | 103911633 | A | 7/2014 |
| CN | 104125711 | A | 10/2014 |
| CN | 104603333 | A | 5/2015 |
| CN | 104619889 | A | 5/2015 |
| CN | 104717831 | A | 6/2015 |
| CN | 104781973 | A | 7/2015 |
| CN | 104812945 | A | 7/2015 |
| CN | 104884409 | A | 9/2015 |
| CN | 104928726 | A | 9/2015 |
| CN | 104992998 | A | 10/2015 |
| CN | 105323958 | A | 2/2016 |
| CN | 105556004 | A | 5/2016 |
| CN | 105813379 | A | 7/2016 |
| CN | 105814242 | A | 7/2016 |
| CN | 105934307 | A | 9/2016 |
| CN | 105986288 | A | 10/2016 |
| CN | 106103082 | A | 11/2016 |
| CN | 106304615 | A | 1/2017 |
| CN | 106350862 | A | 1/2017 |
| CN | 106455310 | A | 2/2017 |
| CN | 106455341 | A | 2/2017 |
| CN | 106455342 | A | 2/2017 |
| CN | 106558703 | A | 4/2017 |
| CN | 106953099 | A | 7/2017 |
| CN | 106982507 | A | 7/2017 |
| CN | 107018624 | A | 8/2017 |
| CN | 107041064 | A | 8/2017 |
| CN | 107801366 | A | 3/2018 |
| CN | 107871847 | A | 4/2018 |
| CN | 107946596 | A | 4/2018 |
| CN | 108124392 | A | 6/2018 |
| CN | 108270015 | A | 7/2018 |
| CN | 108270016 | A | 7/2018 |
| CN | 108306022 | A | 7/2018 |
| CN | 108345195 | A | 7/2018 |
| CN | 108349153 | A | 7/2018 |
| CN | 108690975 | A | 10/2018 |
| CN | 108697006 | A | 10/2018 |
| CN | 108728874 | A | 11/2018 |
| CN | 109788627 | A | 5/2019 |
| CN | 110004467 | A | 7/2019 |

(56) References Cited

FOREIGN PATENT DOCUMENTS

| | | |
|---|---|---|
| EP | 3067442 A | 9/2016 |
| JP | H05-235542 A | 9/1993 |
| JP | 2000-045091 A | 2/2000 |
| JP | 2000-119892 A | 4/2000 |
| JP | 2001-192879 A | 7/2001 |
| JP | 2002-194585 A | 7/2002 |
| JP | 2002-298854 A | 10/2002 |
| JP | 2004-002953 A | 1/2004 |
| JP | 2004-250753 A | 9/2004 |
| JP | 2006-253345 A | 9/2006 |
| JP | 3850155 B2 | 11/2006 |
| JP | 2010-282957 A | 12/2010 |
| JP | 2011149067 A | 8/2011 |
| JP | 2011-192879 A | 9/2011 |
| JP | 2012-136736 A | 7/2012 |
| JP | 2012-172198 A | 9/2012 |
| JP | 2013-133514 A | 7/2013 |
| JP | 103314474 A | 9/2013 |
| JP | 2014015674 A | 1/2014 |
| JP | 2014-132106 A | 7/2014 |
| JP | 2014-194067 A | 10/2014 |
| JP | 2014-208910 A | 11/2014 |
| JP | 2015-042765 A | 3/2015 |
| JP | 5710845 B2 | 4/2015 |
| JP | 5788062 B1 | 9/2015 |
| JP | 2015183294 A | 10/2015 |
| JP | 2016-009526 A | 1/2016 |
| JP | 2016-125126 A | 7/2016 |
| JP | 2016-160503 A | 9/2016 |
| JP | 2017008411 A | 1/2017 |
| JP | 2017-025409 A | 2/2017 |
| JP | 2017-036495 A | 2/2017 |
| JP | 2017-038043 A | 2/2017 |
| JP | 2017036496 A | 2/2017 |
| JP | 2017-076618 A | 4/2017 |
| JP | 2017-203219 A | 11/2017 |
| JP | 2018-026589 A | 2/2018 |
| JP | 2018-028147 A | 2/2018 |
| JP | 2018074153 A | 5/2018 |
| JP | 2018-123430 A | 8/2018 |
| JP | 2018-524772 A | 8/2018 |
| JP | 2018-141230 A | 9/2018 |
| JP | 2018138687 A | 9/2018 |
| JP | 2018-165411 A | 10/2018 |
| JP | 2018-178261 A | 11/2018 |
| JP | 2019-099911 A | 6/2019 |
| JP | 6860706 B2 | 4/2021 |
| KR | 10-2012-0068834 A | 6/2012 |
| KR | 10-2013-0127031 A | 11/2013 |
| KR | 10-2015-0021260 A | 3/2015 |
| KR | 10-1502373 B1 | 3/2015 |
| KR | 10-2015-0062230 A | 6/2015 |
| KR | 10-2017-0046822 A | 5/2017 |
| KR | 10-2018-0020927 A | 2/2018 |
| KR | 10-2018-0080512 A | 7/2018 |
| TW | 201139752 A | 11/2011 |
| TW | 201219606 A | 5/2012 |
| TW | 201301641 A | 1/2013 |
| TW | I417424 B | 12/2013 |
| TW | 201428139 A | 7/2014 |
| TW | 201512466 A | 4/2015 |
| TW | I482882 B | 5/2015 |
| TW | I501865 B | 10/2015 |
| TW | 201706459 A | 2/2017 |
| TW | 201716594 A | 5/2017 |
| TW | 201717712 A | 5/2017 |
| TW | 201718270 A | 6/2017 |
| TW | 201718937 A | 6/2017 |
| TW | 201722219 A | 6/2017 |
| TW | 201726961 A | 8/2017 |
| TW | 201738413 A | 11/2017 |
| TW | 201742212 A | 12/2017 |
| TW | 201809302 A | 3/2018 |
| TW | 201825717 A | 7/2018 |
| TW | 201829183 A | 8/2018 |
| TW | 201829849 A | 8/2018 |
| TW | 201831733 A | 9/2018 |
| TW | 201832922 A | 9/2018 |
| TW | 201834303 A | 9/2018 |
| TW | 201837238 A | 10/2018 |
| TW | 201839147 A | 11/2018 |
| TW | 202030340 A | 8/2020 |
| WO | WO 2007/105635 A | 9/2007 |
| WO | WO2007145164 A1 | 12/2007 |
| WO | WO 2008/132987 A1 | 11/2008 |
| WO | WO 2014/065431 A1 | 5/2014 |
| WO | WO 2014/081041 A1 | 5/2014 |
| WO | WO 2015/104999 A1 | 7/2015 |
| WO | WO 2017/006739 A | 1/2017 |
| WO | WO 2017/051767 A1 | 3/2017 |
| WO | WO 2018/110579 A1 | 6/2018 |
| WO | WO 2018/207786 A1 | 11/2018 |
| WO | WO 2019/027174 A1 | 2/2019 |

OTHER PUBLICATIONS

Taiwan Patent Office,Office Action dated Apr. 12, 2021(TW109101350).
Japan Patent Office, Office Action dated Apr. 27, 2021(JP2020-004657).
Japan Patent Office, Notice of Allowance dated Apr. 27, 2021(JP2020-014029).
Korea Patent Office,Office Action dated Apr. 29, 2021(KR10-2020-0005475).
China Patent Office,Rejection dated May 6, 2021(CN202010044774.X).
Korea Patent Office,Office Action dated May 7, 2021(KR10-2021-0024954).
China Patent Office,Rejection dated May 8, 2021(CN202010040543.1).
China Patent Office,Office Action dated May 24, 2021(CN202010040377.5).
Korea Patent Office,Notice of Allowance dated May 31, 2021(KR10-2021-7003753).
Taiwan Patent Office,Office Action dated Jun. 7, 2021(TW109101297).
Korea Patent Office,Office Action dated Jul. 1, 2021(KR10-2020-0011008).
USPTO, Non-Final Office Action dated Aug. 23, 2019 (U.S. Appl. No. 16/429,921).
C.-H Huang et al., Pulsed Deposition of Ultra-thin Copper Foils, Plating & Surface Finishing, Sep. 2004.
USPTO, Notice of Allowance dated Dec. 12, 2019 (U.S. Appl. No. 16/429,921).
USPTO, Non-Final Office Action dated Jan. 3, 2020 (U.S. Appl. No. 16/654,723).
Belov et al., Correlation between 3d texture of steel substrate and tin-coated surface with various coating masses, 2018.
USPTO, Notice of Allowance dated Jan. 15, 2020 (U.S. Appl. No. 16/584,157).
USPTO, Non-Final Office Action dated Jan. 29, 2020 (U.S. Appl. No. 16/694,434).
USPTO, Non-Final Office Action dated Feb. 10, 2020 (U.S. Appl. No. 16/694,412).
USPTO, Non-Final Office Action dated Feb. 18, 2020 (U.S. Appl. No. 16/715,284).
China Patent Office, International Search Report dated Mar. 24, 2020 (PCT/CN2020/072300).
China Patent Office, International Search Report dated Mar. 26, 2020 (PCT/CN2020/072312).
USPTO, Final Office Action dated Apr. 7, 2020 (U.S. Appl. No. 16/654,723).
Gadelmawla et al., Roughness Parameters, 2002, Journal of Materials Processing Technology.
Ficker et al., Surface Roughness and Porosity of Hydrated Cement Pastes, 2011, ACTA Polytechnica vol. 51 No. Mar. 2011.
China Patent Office, International Search Report dated Apr. 8, 2020 (PCT/CN2020/072158).
China Patent Office, International Search Report dated Apr. 13, 2020 (PCT/CN2020/072305).

(56) References Cited

OTHER PUBLICATIONS

China Patent Office, International Search Report dated Apr. 15, 2020 (PCT/CN2020/072282).
China Patent Office, International Search Report dated Apr. 21, 2020 (PCT/CN2020/072157).
USPTO, Final Office Action dated Apr. 22, 2020 (U.S. Appl. No. 16/715,284).
USPTO, Final Office Action dated Apr. 22, 2020 (U.S. Appl. No. 16/694,434).
USPTO, Final Office Action dated Apr. 22, 2020 (U.S. Appl. No. 16/694,412).
Taiwan Patent Office, Notice of Allowance dated May 25, 2020 (TW109101364).
EPO, European Search Report dated Jun. 5, 2020 (EP20152064.0).
Taiwan Patent Office, Notice of Allowance dated Jun. 15, 2020 (TW109101373).
EPO, European Search Report dated Jun. 16, 2020 (EP20151885.9).
Taiwan Patent Office, Office Action dated Jul. 9, 2020 (TW109101372).
USPTO, Non-Final Office Action dated Jul. 27, 2020 (U.S. Appl. No. 16/654,723).
Taiwan Patent Office, Office Action dated Aug. 14, 2020 (TW109101285).
Taiwan Patent Office, Notice of Allowance dated Aug. 31, 2020 (TW109101360).
Taiwan Patent Office, Office Action dated Sep. 4, 2020 (TW109101301).
Taiwan Patent Office, Office Action dated Sep. 4, 2020 (TW109101355).
Taiwan Patent Office, Office Action dated Sep. 11, 2020 (TW109101361).
Taiwan Patent Office, Office Action dated Sep. 16, 2020 (TW109101365).
China Patent Office, Office Action dated Nov. 9, 2020 (CN202010040365.2).
China Patent Office, Office Action dated Nov. 12, 2020 (CN202010040377.5).
Taiwan Patent Office, Office Action dated Nov. 16, 2020 (TW10921103320).
China Patent Office, Office Action dated Dec. 1, 2020 (CN202010040373.7).
China Patent Office, Office Action dated Dec. 18, 2020 (CN202010040543.1).
China Patent Office, Office Action dated Dec. 21, 2020 (CN202010044774.X).
Japan Patent Office, Office Action dated Aug. 3, 2021(JP2021-506268).
Korea Patent Office, Notice of Allowance dated Oct. 1, 2021(KR10-2021-7001664).
China Patent Office, Office Action dated Oct. 11, 2021(CN202010040377.5).
China Patent Office, Office Action dated Oct. 9, 2021(CN202080001237.5).
International Bureau, International preliminary report dated Aug. 12, 2021(PCT/CN2020/072158).
International Bureau, International preliminary report dated Aug. 12, 2021(PCT/CN2020/072157).
Japan Patent Office, Office Action dated Oct. 26, 2021(JP2021-503555).
Japan Patent Office,Notice of Reasons for Refusal dated Mar. 10, 2020 (JP2020-004656).
Taiwan Patent Office, Office Action dated Mar. 18, 2020 (TW109101362).
Korea Patent Office, Office Action dated May 7, 2020 (KR10-2020-0005565).
Japan Patent Office,Notice of Reasons for Refusal dated Aug. 18, 2020 (JP2020-004660).
Korea Patent Office, Office Action dated Aug. 31, 2020 (KR10-2020-0005565).
Korea Patent Office, Office Action dated Sep. 7, 2020 (KR10-2020-0005338).
Japan Patent Office, Office Action dated Oct. 13, 2020 (JP2020-004658).
Japan Patent Office,Notice of Reasons for Refusal dated Oct. 13, 2020 (JP2020-004661).
Japan Patent Office, Office Action dated Oct. 20, 2020 (JP2020004659).
Korea Patent Office, Office Action dated Oct. 26, 2020 (KR10-2020-0005542).
Korea Patent Office, Office Action dated Nov. 14, 2020 (KR10-2020-0005476).
Korea Patent Office, Office Action dated Dec. 1, 2020 (KR10-2020-0005337).
Japan Patent Office,Notice of Reasons for Refusal dated Dec. 1, 2020 (JP2020-004660).
Korea Patent Office, Office Action dated Jan. 19, 2021 (KR10-2020-0005338).
Korea Patent Office, Rejection dated Jan. 22, 2021 (KR10-2020-0005565).
Japan Patent Office, Notice of Allowance dated Feb. 15, 2022 (JP2021-503555).
Japan Patent Office, Notice of Allowance dated Nov. 16, 2021(JP2021-506268).
Korea Patent Office, Final Rejection dated Nov. 18, 2021(KR10-2021-0024954).
Japan Patent Office, Office Action dated Jan. 4, 2022(JP2021-500102).
China Patent Office, Office Action dated Jan. 7, 2022(CN202010043439.8).
China Patent Office, Notice of Allowance dated Jan. 11, 2022(CN202080001237.5).
US Patent Office, Notice of Allowance dated Jan. 4, 2022(U.S. Appl. No. 17/259,333).
China Patent Office, Office Action dated Mar. 21, 2022 (CN202080001233.7).
European Patent Office, Extended European search report dated Mar. 31, 2022 (EP20749192.9).
China Patent Office, Office Action dated Jan. 20, 2022 (CN202010040372.2).
Japan Patent Office, Office Action dated Feb. 8, 2022 (JP2021-500101).
Japan Patent Office, Office Action dated Feb. 8, 2022 (JP2021-500514).
China Patent Office, Decision of Reexamination dated Feb. 24, 2022 (CN202010040543.1).
China Patent Office, Office Action dated Mar. 10, 2022 (CN202010044774.X).
Japan Patent Office, Office Action dated Mar. 22, 2022 (JP2021-540364).
European Patent Office, Extended European search report dated Apr. 19, 2022 (EP20749195.2).

* cited by examiner

ELECTRODEPOSITED COPPER FOIL AND ELECTRODE, AND LITHIUM-ION SECONDARY BATTERY COMPRISING THE SAME

CROSS-REFERENCE TO RELATED APPLICATION

This application is a U.S. national stage application under 35 U.S.C. § 371 of PCT/CN2020/072157 filed on Jan. 15, 2020, which claims the benefit under 35 U.S.C. § 119(e) of U.S. Provisional Application No. 62/800,263 filed on Feb. 1, 2019 and U.S. application Ser. No. 16/584,157 filed on Sep. 26, 2019. The contents of the prior applications are incorporated herein by reference in their entirety.

BACKGROUND

1. Field of the Disclosure

The instant disclosure relates to an electrodeposited copper foil. In addition, the instant disclosure also relates to a lithium-ion secondary battery comprising said electrodeposited copper foil.

2. Description of the Prior Arts

Lithium-ion secondary batteries have both high energy and high power density, making it the top choice of power supply products for fields of portable electronic devices such as cell phones and tablets, power tools, electric vehicles ("EVs"), energy storage systems ("ESS"), space applications, military applications, and railways. Electric vehicles include hybrid electric vehicles ("HEVs"), plug-in hybrid electric vehicles ("PHEVs"), and pure battery electric vehicles ("BEVs"). If EVs replace the majority of fossil fuel (e.g., gasoline, diesel fuel, etc.) powered transportation, lithium-ion secondary batteries will significantly reduce greenhouse gas emissions. Moreover, the high energy efficiency of the lithium-ion secondary batteries may allow their use in various electric grid applications, including improving the quality of energy harvested from wind, solar, geothermal and other renewable resources, thereby conducing to widely build an energy-sustainable society.

Therefore, lithium-ion secondary batteries become a focus of research for commercial ventures as well as governments and academic laboratories. Although research and development in this field has abounded in recent years and lithium-ion secondary batteries are currently in use, there remains a need for improvements with respect to higher capacity, higher current generation, and batteries that can undergo more charge/discharge cycles thereby extending their useful life. Additionally, there remains a demand for reduction in the weight of the lithium-ion secondary batteries which may be beneficial to improve applications in several fields such as electric vehicles and portable electronics.

Lithium-ion secondary batteries usually include a current collector of a metal foil which is deposited with an active material thereon, and the active material usually comprises a binder and an active substance. Copper foils are especially suitable for use as the current collector because copper has a good electrical conductivity. With the development trend of lightweight, the current collector needs to be thinner to reduce the size and weight of the lithium-ion secondary battery. Additionally, in order to increase the capacity of the lithium-ion secondary battery, materials such as silicon (Si), germanium (Ge), and tin (Sn) are mixed with the high-capacity active material and filled in a lithium-ion secondary battery, intensifying the expansion and contraction of the active material and increasing the stresses on the copper foil with which the active material is in contact. Furthermore, in order to increase the capacity of the lithium-ion secondary battery, the copper foil is folded or bent and wound. If the copper foil cracks because it cannot withstand the expansion and contraction of the active material during battery uses, or cannot withstand folding and winding during the manufacturing process of the lithium-ion secondary battery, the cycle characteristics of the lithium-ion secondary battery are adversely affected.

In short, there still remains a demand to improve copper foils for use in lithium-ion secondary batteries. For example, the adhesive strength between the copper foil and the active material still needs to be improved, so as to avoid the failures resulting from the separation between the negative electrode active material and the copper foil or fractures of the copper foil under high cycles of charge and discharge.

SUMMARY OF THE DISCLOSURE

In a first aspect, the instant disclosure provides an electrodeposited copper foil comprising a drum side and a deposited side opposing the drum side, wherein at least one of the drum side and the deposited side exhibits a void volume ("Vv") in the range of 0.17 $\mu m^3/\mu m^2$ to 1.17 $\mu m^3/\mu m^2$; and an absolute value of a difference between a maximum height ("Sz") of the drum side and a Sz of the deposited side is in the range of less than 0.60 µm.

Preferably, the drum side exhibits a Vv in the range of 0.17 $\mu m^3/\mu m^2$ to 1.17 $\mu m^3/\mu m^2$, and the deposited side also exhibits a Vv in the range of 0.17 $\mu m^3/\mu m^2$ to 1.17 $\mu m^3/\mu m^2$.

Preferably, an absolute value of a difference between the Vv of the drum side and the Vv of the deposited side (i.e. $\Delta Vv$) is not larger than 0.80 $\mu m^3/\mu m^2$. In some embodiments, the $\Delta Vv$ is in the range of 0.00 $\mu m^3/\mu m^2$ to 0.70 $\mu m^3/\mu m^2$.

The above-mentioned surface texture or feature of the electrodeposited copper foil may affect the properties or final performance when it is applied to a lithium-ion secondary battery.

The feature includes the void volume of a surface of the electrodeposited copper foil. Based on an areal material ratio curve in Standard Method ISO 25178-2:2012, the void volume is calculated by integrating an area enclosed by the areal material ratio curve at the height of a specified material ratio ("mr"). The Vv represents the total volume of voids per unit area on a certain surface of the electrodeposited copper foil. With reference to the left side of FIG. 1, it shows a three-dimensional surface of the drum side or the deposited side of an electrodeposited copper foil. It can draw a corresponding areal material ratio curve shown as the right side of FIG. 1. The top of the highest peak is set as mr of 0%, and the bottom of the lowest valley is set as mr of 100%. The Vv is calculated by integrating the volume of the voids enclosed below a horizontal cutting plane (its height corresponding to a specified material ratio between 0% and 100%) and above all of the bottom of the valleys. For example, when the mr is at 100%, the corresponding Vv is zero; in contrast, when the mr is at 0%, the corresponding Vv is the maximum. Unless otherwise specified, the Vv listed in this specification refers to the void volume at the mr of 10%, which is the area indicated as Vv in FIG. 1.

Further, with reference to FIG. 2, the core void volume ("Vvc") is the difference in void volume between a first material ratio and a second material ratio. Unless otherwise specified, Vvc listed in this specification is the difference in void volume between the first material ratio of 10% and the second material ratio of 80%; that is, the area is indicated as Vvc in FIG. 2. In addition, the dale void volume, which is also called valley void volume ("Vvv"), is the void volume at the second material ratio. Unless otherwise specified, Vvv listed in this specification is the void volume at mr of 80%; that is, the area is indicated as Vvv in FIG. 2. In short, the Vv is the sum of the Vvc and the Vvv.

In some embodiments, at least one of the drum side and the deposited side exhibits a Vvc in the range of 0.16 $\mu m^3/\mu m^2$ to 1.07 $\mu m^3/\mu m^2$. In other embodiments, the drum side exhibits a Vvc in the range of 0.16 $\mu m^3/\mu m^2$ to 1.07 $\mu m^3/\mu m^2$, and the deposited side also exhibits a Vvc in the range of 0.16 $\mu m^3/\mu m^2$ to 1.07 $\mu m^3/\mu m^2$.

In some embodiments, at least one of the drum side and the deposited side exhibits a Vvv in the range of 0.01 $\mu m^3/\mu m^2$ to 0.10 $\mu m^3/\mu m^2$. In other embodiments, the drum side exhibits a Vvv in the range of 0.01 $\mu m^3/\mu m^2$ to 0.10 $\mu m^3/\mu m^2$, and the deposited side also exhibits a Vvv in the range of 0.01 $\mu m^3/\mu m^2$ to 0.10 $\mu m^3/\mu m^2$.

In accordance with the instant disclosure, a Sz is defined as the sum of the peak height value of the highest peak ("Sp") and the pit depth value of the lowest valley ("Sv") within a specific area according to ISO 25178-2:2012. In some embodiments, the absolute value of a difference between a Sz of the drum side and a Sz of the deposited side (i.e. $\Delta Sz$) is larger than or equal to 0.05 $\mu m$ and smaller than or equal to 0.59 $\mu m$.

In some embodiments, at least one of the drum side and the deposited side exhibits a Sz in the range of 1.24 $\mu m$ to 3.25 $\mu m$. In other embodiments, the drum side exhibits a Sz in the range of 1.24 $\mu m$ to 3.25 $\mu m$, and the deposited side exhibits a Sz in the range of 1.24 $\mu m$ to 3.25 $\mu m$.

The electrodeposited copper foil comprises a bare copper foil and a surface-treated layer disposed on the bare copper foil; wherein the drum side and the deposited side are respectively on both of the outermost surfaces of the electrodeposited copper foil, and the outermost surface of the surface-treated layer is the drum side or the deposited side.

In accordance with the instant disclosure, the drum side and the deposited side of the electrodeposited copper foil refer to the two opposite outermost surfaces of the electrodeposited copper foil; that is, the drum side and the deposited side are respectively located on both of the outermost surfaces of the electrodeposited copper foil.

These terms relate to a manufacturing process for producing electrodeposited copper foils. The manufacturing process at least comprises an electrodeposition step: a cathode drum is immersed in a copper electrolyte solution which contains copper ions and optionally other additives (such as rare earth metals and organic additives, but not limited thereto). Under operation of a direct current, the copper ions in the copper electrolyte solution are electrodeposited on the cathode drum to form a bare copper foil. As the bare copper foil accumulates to a predetermined thickness, the bare copper foil is pulled off the surface of the cathode drum and rolled up in a continuous process. Regardless whether the bare copper foil is subjected to any subsequent surface treatment after the electrodeposition step, the two opposite outermost surfaces of the electrodeposited copper foil are defined by the relationship that bare copper foil is in relation to the cathode drum and the copper electrolyte solution in this specification. Among them, the side of the bare copper foil in contact with the surface of the cathode drum is called "drum side", and the other side of the bare copper foil opposite the drum side is called "deposited side."

In one embodiment, the electrodeposited copper foil may be the bare copper foil produced after the electrodeposition step, which is a bare copper foil without any surface treatment. That is, the surface of the bare copper foil close to the surface of the cathode drum is called "drum side" while the surface of the bare copper foil close to the copper electrolyte solution is called "deposited side"; both of the drum side and the deposited side are on the outermost surfaces of the electrodeposited copper foil. In other embodiment, a single-side surface treatment is performed after the electrodeposition step, and the resulted electrodeposited copper foil comprises a bare copper foil and one surface-treated layer disposed on the bare copper foil. In the case that the single-side surface treatment is performed to the surface of the bare copper foil close to the cathode drum as an example, the surface-treated layer is disposed on the surface of the bare copper foil close to the cathode drum; therefore, "the drum side" refers to the outer surface of the surface-treated layer, and "the deposited side" refers to the surface of the bare copper foil close to the copper electrolyte solution; and both of the drum side and the deposited side are on the outermost surfaces of the electrodeposited copper foil. In another embodiment, a double-side surface treatment is performed after the electrodeposition step, and the resulted electrodeposited copper foil comprises a bare copper foil and two surface-treated layers disposed on the bare copper foil. Therefore, "the drum side" refers to the outer surface of the surface-treated layer which is disposed on the surface of the copper foil close to the cathode drum, and "the deposited side" refers to the outer surface of the another surface-treated layer, which is disposed on the surface of the copper foil close to the copper electrolyte solution; and both of the drum side and the deposited side are on the outermost surfaces of the electrodeposited copper foil.

Preferably, the surface-treated layer is at least one selected from the group consisting of: a zinc-chromium layer, a chromium layer, and an organic layer. For example, the chromium layer may be a chromium coating formed by coating paint; or, the chromium layer may be a chromium plating formed by electroplating, but it is not limited thereto.

Some additional properties according to the first aspect of the instant disclosure may further comprise the following. Preferably, the electrodeposited copper foil has a thickness in the range of 2 $\mu m$ to 25 $\mu m$. In one embodiment, the electrodeposited copper foil further exhibits a ratio of a fatigue life of the electrodeposited copper foil to a thickness of the electrodeposited copper foil in the range of more than 5 times/m. Preferably, the ratio of a fatigue life of the electrodeposited copper foil to a thickness of the electrodeposited copper foil is in the range of 8 times/$\mu m$ to 40 times/m.

In a second aspect, the instant disclosure provides an electrode for a lithium-ion secondary battery comprising the above-mentioned electrodeposited copper foil. The electrodeposited copper foil is particularly suitable for use as a current collector for a lithium-ion secondary battery.

In general, the electrode further comprises at least one binder and at least one active substance. In some embodiment, the binder and the active substance are in contact with the deposited side of the electrodeposited copper foil. In another embodiment, the binder and the active substance are in contact with the drum side of the electrodeposited copper foil.

In addition, the instant disclosure provides a lithium-ion secondary battery, which comprises the above-mentioned electrode for a lithium-ion secondary battery. Specifically, the lithium-ion secondary battery comprises a positive electrode, a negative electrode and an electrolyte solution. In some embodiments, the positive electrode and the negative electrode are separated by a separator in the lithium-ion secondary battery.

The electrodeposited copper foils as described in this specification show excellent properties, for example, when they are used in lithium-ion secondary batteries. In addition to allowing the fabrication of light lithium-ion secondary batteries with high capacity, the lithium-ion secondary batteries made with these electrodeposited copper foils have excellent charge-discharge cycling properties. Specifically, since the electrodeposited copper foils of the instant disclosure have the above-mentioned features of the Vv of both surfaces of the electrodeposited copper foils and the absolute value of the difference in Sz between the both surfaces of the electrodeposited copper foils, when being applied in a lithium-ion secondary battery, the electrodeposited copper foil can have an excellent adhesion strength to the active material, thereby improving the condition that the active material is easily peeled off from the surface of the electrodeposited copper foil during charge-discharge cycling or reducing the occurrence of fracture in the electrodeposited copper foil. Accordingly, the cycle life performance of the lithium-ion secondary battery will be better.

In this specification, the electrodeposited copper foils have quantifiable characteristics which provide good performance when used as current collectors. For example, the electrodeposited copper foil can be combined with the active material to provide a negative electrode for lithium-ion secondary batteries. In some embodiments, the electrodeposited copper foils feature the Vv of the copper foils and the absolute value of the difference in Sz between the both surfaces of the copper foils.

In some embodiments, the Vv of the drum side and/or the deposited side of the electrodeposited copper foils is in the range of 0.17 $\mu m^3/\mu m^2$ to 1.17 $\mu m^3/\mu m^2$. If the Vv is too low, (such as less than 0.17 $\mu m^3/\mu m^2$), the adhesion of the copper foil to the active material is poor due to too weak anchor effect. On the other hand, if the Vv is too high (such as above 1.17 $\mu m^3/\mu m^2$), the active material can neither fill up the valley, nor be coated uniformly and effectively on the surface of the electrodeposited copper foil; therefore, the adhesion of the electrodeposited copper foil to the active material is still poor. In short, when the Vv is too low and too high, the adhesion of the active material to the electrodeposited copper foil is poorer; accordingly, the batteries made with the aforesaid electrodeposited copper foils will exhibit poorer battery characteristics.

At least one of the drum side or deposited side of the electrodeposited copper foil just has the Vv in the above-mentioned range, and the Vv of the drum sides and the deposited side are independently selected parameters. It is to be understood that the aforementioned ranges are continuous and could be represented as any of the following values (units of the following values are $\mu m^3/\mu m^2$): 0.17, 0.18, 0.19, 0.20, 0.21, 0.22, 0.23, 0.24, 0.25, 0.26, 0.27, 0.28, 0.29, 0.30, 0.31, 0.32, 0.33, 0.34, 0.35, 0.36, 0.37, 0.38, 0.39, 0.40, 0.41, 0.42, 0.43, 0.44, 0.45, 0.46, 0.47, 0.48, 0.49, 0.50, 0.51, 0.52, 0.53, 0.54, 0.55, 0.56, 0.57, 0.58, 0.59, 0.60, 0.61, 0.62, 0.63, 0.64, 0.65, 0.66, 0.67, 0.68, 0.69, 0.70, 0.71, 0.72, 0.73, 0.74, 0.75, 0.76, 0.77, 0.78, 0.79, 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 0.98, 0.99, 1.00, 1.01, 1.02, 1.03, 1.04, 1.05, 1.06, 1.07, 1.08, 1.09, 1.10, 1.11, 1.12, 1.13, 1.14, 1.15, 1.16, and 1.17, but it is not limited thereto. Each of the above specific values can represent an endpoint in another range of values.

The $\Delta Sz$ of the electrodeposited copper foil is just within the above-mentioned range. It is to be understood that the aforementioned ranges are continuous and could be represented as any of the following values (units of the following values are $\mu m$): 0.60, 0.58, 0.56, 0.54, 0.52, 0.50, 0.48, 0.46, 0.44, 0.42, 0.40, 0.38, 0.36, 0.34, 0.32, 0.30, 0.28, 0.26, 0.24, 0.22, 0.20, 0.18, 0.16, 0.15, 0.14, 0.12, 0.10, 0.09, 0.08, 0.07, 0.06, 0.05, 0.04, 0.03, 0.02, 0.01, 0.00, but it is not limited thereto. Each of the above specific values can represent an endpoint in another range of values. When the $\Delta Sz$ is not within the aforementioned range, the electrodeposited copper foil is prone to wrinkles.

Similarly, the Vvc in the range of 0.16 $\mu m^3/\mu m^2$ to 1.07 $\mu m^3/\mu m^2$ is also continuous; any specific value within the above range can represent an endpoint in another range of values. The Vvv in the range of 0.01 $\mu m^3/\mu m^2$ to 0.10 $\mu m^3/\mu m^2$ is also continuous; any specific value within the above range can represent an endpoint in another range of values.

In accordance with the instant disclosure, the $\Delta Vv$ is also in a continuous range; any specific value within the above range can represent an endpoint in another range of values.

In accordance with the instant disclosure, the drum side and/or the deposited side respectively have a Sz in the range of 1.24 $\mu m$ to 3.25 $\mu m$ which is a continuous range; any specific value within the above range can represent an endpoint in another range of values.

In accordance with the instant disclosure, "fatigue life" is a quantitative measurement relating to the bending properties. Hereafter, a fatigue life test is described in detail. Since the bending properties of the copper foil can influence the adhesion to the active material, such as conductive carbon-containing materials adhesive to the electrodeposited copper foil, the performance of the lithium-ion second battery will be influenced. Since the thickness of the electrodeposited copper foil will affect the performance of the fatigue life of the electrodeposited copper foil, the bending resistance of the copper foil is represented by a fatigue life per unit thickness in the instant disclosure, that is, the ratio of the fatigue life of the electrodeposited copper foil to the thickness of the electrodeposited copper foil. In some embodiments, the electrodeposited copper foil of the instant disclosure has a high bending resistance. In some embodiments, the ratio of the fatigue life of the electrodeposited copper foil to the thickness of the electrodeposited copper foil is more than 5 times/$\mu m$; for example, the ratio may be 8 times/m, 10 times/m, 20 times/$\mu m$ or 30 times/m, but it is not limited thereto. If the ratio is too low, the electrodeposited copper foil will easily fracture and fail during the charge-discharge cycling.

In some embodiments, the electrodeposited copper foil can be used to form a lithium-ion secondary battery, such as a laminated type lithium-ion battery or a coin type lithium-ion battery, but it is not limited thereto.

In some embodiments, when the surface of the electrodeposited copper foil is coated with a negative electrode active material, a negative electrode is formed.

In some embodiments, the electrodeposited copper foil may comprise an anti-tarnish layer formed on the drum side and/or the deposited side. The anti-tarnish layer can protect the electrodeposited copper foil from degradation such as due to corrosion.

In accordance with the instant disclosure, the electrodeposited copper foil may be formed through any known methods of surface treatment comprising a step of the bare copper foil obtained from the electrodeposition step being dipped or passing through a solution containing an anti-tarnish material, or further plating (e.g., electroplating) a metal or alloy film on the bare copper foil. For example, the solution containing an anti-tarnish material may comprise zinc (Zn), chromium (Cr), nickel (Ni), cobalt (Co), molybdenum (Mo), vanadium (V) or any combination thereof; or the solution containing an anti-tarnish material may comprise an organic compound. The processing can be continuous and be part of the overall process in producing the electrodeposited copper foil.

The charge-discharge testing refers to testing where a specific potential is applied across the positive and negative electrodes of a battery so as to charge the battery, and then connecting the positive and negative electrodes across a load and allowing the current to pass through the load to discharge the battery. A combination of one charge and one discharge represents one charge-discharge cycle. The charge-discharge testing can be done to simulate how well a lithium-ion second battery performs with respect to repeated use. The "cycle life" or "charge-discharge cycle life" is defined as the number of charge-discharge cycles a lithium-ion second battery can perform when the capacity of the tested lithium-ion second battery falls to 80% of its initial capacity.

In some embodiments, the electrodeposited copper foils can be used as current collectors for batteries (e.g., lithium-ion secondary batteries) and are used in electronic devices that require lightweight, compact, independent, or portable batteries. For example, the electronic devices may comprise, but is not limited to, vehicles (e.g., automobiles, streetcars, buses, trucks, boats, submarines, airplanes), computers (e.g., for microcontrollers, laptops, tablets), phones (e.g., smart phones, wireless landlines), personal health monitoring equipment (e.g., glucose monitors, pacemakers), power tools (e.g., electric drills, chainsaws), illuminators (e.g., flashlights, emergency lighting, signs), hand-held measuring devices (e.g., pH meters, air monitoring devices) and habitation units (e.g., in a spaceship, in a trailer, in a house, in a plane, or in a submarine).

DETAILED DESCRIPTION OF THE DISCLOSURE

Figure 1:
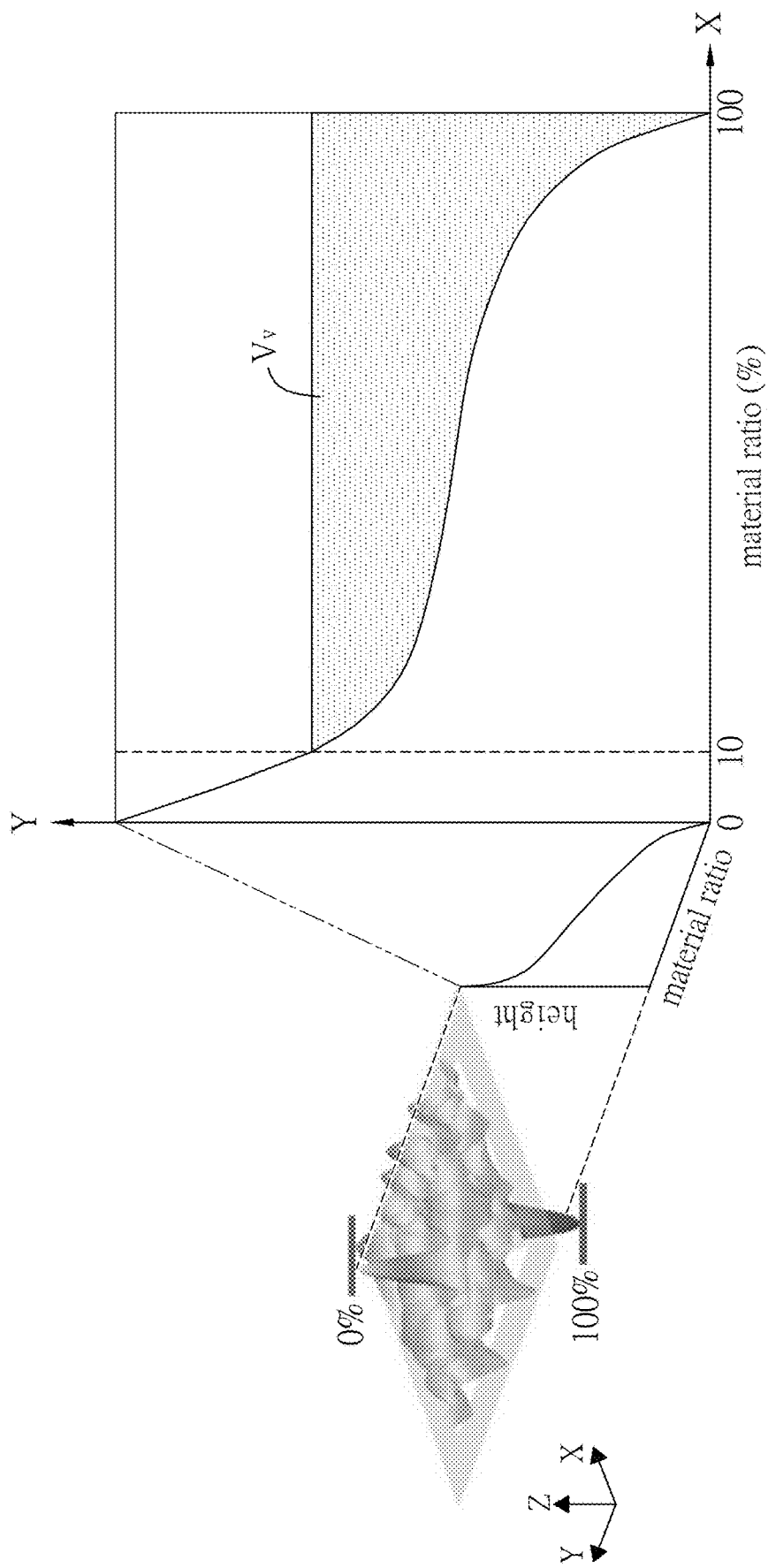
FIG. 1 shows a schematic plot of Vv in an areal material ratio plot.
Figure 2:
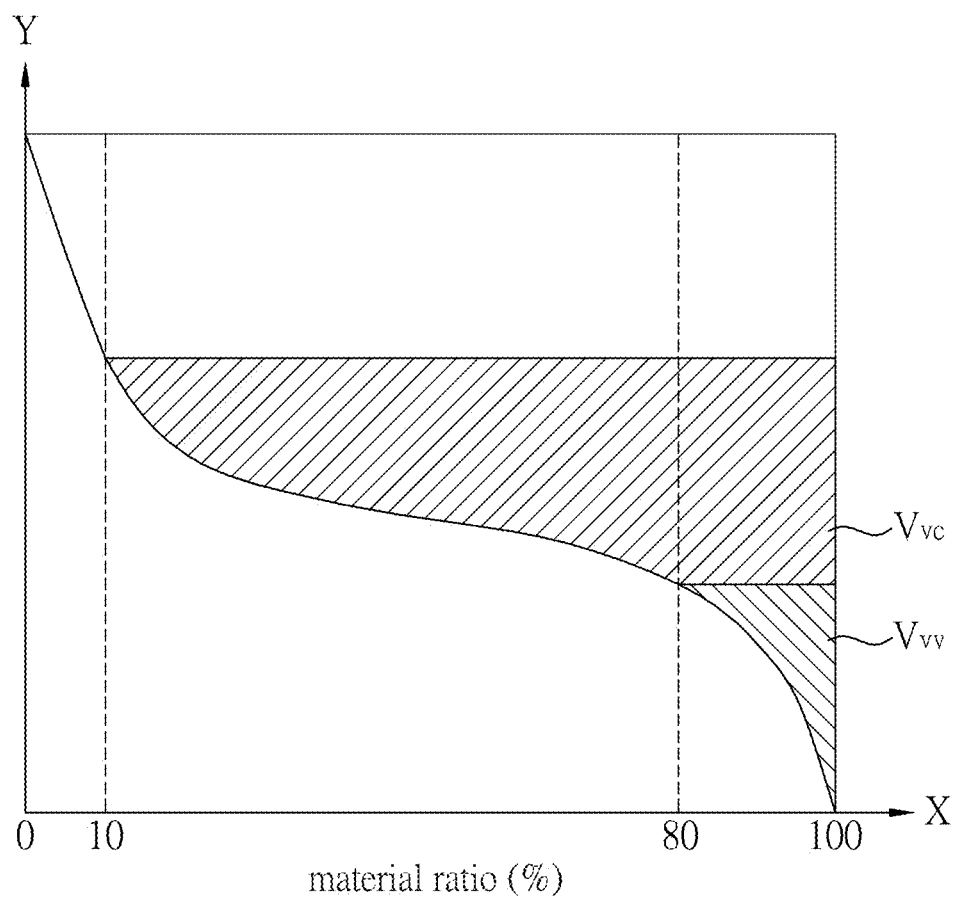
FIG. 2 shows a schematic plot of Vvc and Vvv in an areal material ratio plot.

Hereinafter, one skilled in the art can easily realize the advantages and effects of the instant disclosure from the following examples. Therefore, it should be understood that the descriptions proposed herein are just preferable examples for the purpose of illustrations only, not intended to limit the scope of the disclosure. Various modifications and variations could be made in order to practice or apply the instant disclosure without departing from the spirit and scope of the instant disclosure.

<Electrodeposited Copper Foil>

Examples 1 to 7 (E1 to E7), Comparative Examples 1 to 7 (C1 to C7): Electrodeposited Copper Foil The manufacturing apparatus for preparing electrodeposited copper foils comprises an electrodeposition equipment, a series of guide rollers and a surface treatment equipment. The electrodeposition equipment comprises a rotatable cathode drum and an insoluble anode, a copper electrolyte solution and a feed pipe. The insoluble anode is arranged at the lower half of the cathode drum and surrounds the cathode drum. The cathode drum and the anode plate are spaced apart from each other and allow the copper electrolyte solution to be introduced through the feed pipe. The surface treatment equipment comprises an anti-tarnish treatment tank and electrode plates disposed therein.

During the manufacturing process of preparing Examples 1, 4 to 7 and Comparative Example 4, as indicated in Table 1 below, the insoluble anode was covered with an anode bag (product model: BEIP308W10L20, manufactured by Taiwan Grace International Corp). The anode bag enclosed the insoluble anode but was open at the top, above the fluid level of the copper electrolyte solution. This allowed oxygen bubbles to flow out of the copper electrolyte solution and be away from the surface of the insoluble anode.

In the electrodeposition step, a continuous direct current was applied to make the copper electrolyte solution flow between the cathode drum and the insoluble anode to make copper ions in the copper electrolyte solution continuously electrodeposited on the surface of the cathode drum and thereby forming the bare copper foil. Subsequently, the bare copper foil was peeled off from the cathode drum and guided to one of the guide rollers. After that, the bare copper foil was transported to the surface treatment equipment to undergo an anti-tarnish treatment. The bare copper foil was immersed in an anti-tarnish treatment tank filled with an anti-tarnish solution, and a continuous electroplating was applied to both of the opposite surfaces of the bare copper foil by using the electrode plates, thereby forming two surface-treated layers (i.e. anti-tarnish layers) respectively attached on both of the surfaces of the bare copper foil.

The composition of the copper electrolyte solution and the manufacturing parameters of the electrodeposition step were as follows.

1. The composition of the copper electrolyte solution:
   (1) Sulfuric acid with a concentration of 50 wt %: 75 grams per liter (g/L);
   (2) Copper sulfate ($CuSO_4 \cdot 5H_2O$): 280 g/L;
   (3) Chloride ion (derived from HCl, purchased from RCI Labscan Ltd.): 15 milligrams per liter (mg/L);
   (4) Cerium citrate ($Ce(SO_4)_2$): 0 milligram per liter (mg/L) to 55 mg/L (purchased from Sigma-Aldrich), wherein the content ratios of the cerium citrate in the copper electrolyte solution used to prepare the electrodeposited copper foils of E1 to E7 and C1 to C7 were listed in Table 1.

2. Manufacturing parameters:
   (1) Temperature of the copper electrolyte solution: 40° C.;
   (2) Current density: 33 amperes per square decimeter ($A/dm^2$) to 65 $A/dm^2$.

Wherein the current densities applied to prepare the electrodeposited copper foils of E1 to E7 and C1 to C7 were listed in Table 1.

The composition of the anti-tarnish solution and the manufacturing parameters of the anti-tarnish treatment were listed below.

1. The composition of the anti-tarnish solution: chromic acid ($CrO_3$): 1500 mg/L (purchased from Sigma-Aldrich).

2. Manufacturing parameters:
   (1) Temperature of the anti-tarnish solution: 25° C.;
   (2) Current density: 0.5 $A/dm^2$;
   (3) Plating time: 1 second (sec).

Analysis 1: Weight and Average Thickness Per Unit Area of the Electrodeposited Copper Foil Each of the electrodeposited copper foils of Examples 1 to 7 and Comparative Examples 1 to 7 was cut into a test sample of 100 mm in length and width, and each test sample was weighed by the microbalance AG-204 (purchased from Mettler Toledo International Inc.); further, the measured weight value of each test sample was divided by its area, thereby obtaining the weight per unit area of each of the electrodeposited copper foils (unit: g/m$^2$).

Moreover, according to the Standard Method of IPC-TM-650 2.4.18, the density of the electrodeposited copper foils was about 8.909 g/cm$^3$. Then, an average thickness of each of the electrodeposited copper foils of E1 to E7 and C1 to C7 was respectively calculated by the following formula (I). Therefore, the weight per unit area and average thickness of each of the electrodeposited copper foils of E1 to E7 and C1 to C7 were listed in Table 1.

$$\text{Average thickness}(\mu m) = \text{weight per unit area}(g/m^2) / \text{density of the electrodeposited copper foil}(g/m^3) \quad (I)$$

Analysis 2: Surface Texture Analysis of the Electrodeposited Copper Foil

Surface texture of each of the electrodeposited copper foils of E1 to E7 and C1 to C7 was observed by a laser scanning confocal microscope and the resulting images were taken. Moreover, the respective Vv, Vvc and Vvv of the drum side and the deposited side of the electrodeposited copper foils of E1 to E7 and C1 to C7 were analyzed in accordance with the Standard Method of ISO 25178-2: 2012, and then the analytical results were listed in Table 2. In addition, the relevant instruments and test conditions were recorded as follows.

1. Instruments:
   (1) Laser scanning confocal microscope: Model: LEXT OLS5000-SAF manufactured by Olympus;
   (2) Objective lenses: MPLAPON-100xLEXT.
2. Test conditions:
   (1) Analytical environment: temperature of 24±3° C. and a relative humidity of 63±3%;
   (2) Light source: 405 nm-wavelength;
   (3) Objective lens magnification: 100× magnification;
   (4) Optical zoom: 1.0×;
   (5) Image area: 129 μm×129 μm;
   (6) Resolution: 1024 pixels×1024 pixels;
   (7) Condition setting: auto tilt removal;
   (8) Filter setting: no filter.

Vv was calculated at a material ratio of 10%.

Further, Vvv was calculated at a material ratio of 80%.

Further, Vvc was a difference in void volume between the material ratios of 10% and 80%.

Analysis 3: Sz Analysis of the Electrodeposited Copper Foil

According to the Standard Method of ISO 25178-2: 2012, the respective Sz of the drum side and the deposited side of the electrodeposited copper foils of E1 to E7 and C1 to C7 were measured, and then an absolute value of the resulting difference between the Sz of the drum side and the Sz of the deposited side in each group was respectively calculated, and the analytical results were listed in Table 2. Besides, the relevant test conditions were recorded as the same as Analysis 2.

TABLE 1

| Example No. | With or Without anode bag | Content ratio of Ce(SO$_4$)$_2$ (mg/L) | Current density (A/dm$^2$) | Weight per unit area (g/m$^2$) | Average thickness (μm) |
|---|---|---|---|---|---|
| E1 | With | 45 | 33 | 53.5 | 6.0 |
| E2 | Without | 15 | 33 | 53.5 | 6.0 |
| E3 | Without | 45 | 33 | 53.5 | 6.0 |
| E4 | With | 55 | 65 | 53.5 | 6.0 |
| E5 | With | 0 | 33 | 53.5 | 6.0 |
| E6 | With | 45 | 33 | 25.4 | 2.9 |
| E7 | With | 45 | 33 | 187.1 | 21.0 |
| C1 | Without | 0 | 33 | 53.5 | 6.0 |
| C2 | Without | 5 | 33 | 53.5 | 6.0 |
| C3 | Without | 55 | 33 | 53.5 | 6.0 |
| C4 | With | 55 | 33 | 53.5 | 6.0 |
| C5 | Without | 55 | 65 | 53.5 | 6.0 |
| C6 | Without | 45 | 38 | 53.5 | 6.0 |
| C7 | Without | 50 | 43 | 53.5 | 6.0 |

TABLE 2

| Example No. | Vv (μm$^3$/μm$^2$) Drum Side | Vv (μm$^3$/μm$^2$) Deposited side | Vvc (μm$^3$/μm$^2$) Drum side | Vvc (μm$^3$/μm$^2$) Deposited side | Vvv (μm$^3$/μm$^2$) Drum Side | Vvv (μm$^3$/μm$^2$) Deposited side | Sz (μm) Drum side | Sz (μm) Deposited side | ΔSz (μm) |
|---|---|---|---|---|---|---|---|---|---|
| E1 | 0.17 | 0.20 | 0.16 | 0.18 | 0.01 | 0.02 | 2.57 | 2.18 | 0.39 |
| E2 | 1.17 | 1.14 | 1.07 | 1.05 | 0.10 | 0.09 | 1.47 | 1.99 | 0.52 |
| E3 | 0.72 | 0.75 | 0.65 | 0.68 | 0.07 | 0.07 | 2.07 | 2.64 | 0.57 |
| E4 | 0.33 | 1.02 | 0.29 | 0.92 | 0.04 | 0.10 | 3.25 | 2.99 | 0.26 |
| E5 | 0.28 | 0.25 | 0.23 | 0.22 | 0.05 | 0.03 | 1.24 | 1.42 | 0.18 |
| E6 | 0.18 | 0.21 | 0.17 | 0.17 | 0.01 | 0.04 | 2.69 | 2.34 | 0.35 |
| E7 | 0.19 | 0.19 | 0.17 | 0.16 | 0.02 | 0.03 | 2.42 | 2.49 | 0.07 |
| C1 | 1.44 | 1.47 | 1.29 | 1.31 | 0.15 | 0.16 | 0.66 | 1.37 | 0.71 |
| C2 | 1.50 | 1.52 | 1.29 | 1.29 | 0.21 | 0.23 | 0.71 | 1.40 | 0.69 |
| C3 | 0.06 | 0.05 | 0.05 | 0.04 | 0.01 | 0.01 | 3.63 | 3.03 | 0.60 |
| C4 | 0.04 | 0.03 | 0.03 | 0.02 | 0.01 | 0.01 | 2.99 | 2.74 | 0.25 |
| C5 | 0.43 | 1.33 | 0.38 | 1.21 | 0.05 | 0.12 | 3.76 | 4.41 | 0.65 |
| C6 | 0.23 | 0.44 | 0.16 | 0.38 | 0.07 | 0.06 | 2.14 | 2.75 | 0.61 |
| C7 | 0.26 | 0.53 | 0.18 | 0.44 | 0.08 | 0.09 | 2.18 | 2.93 | 0.75 |

Analysis 4: Fatigue Life Analysis of the Electrodeposited Copper Foil

According to Standard Method IPC-TM-650 2.4.2.1, respective fatigue lives of the electrodeposited copper foils of E1 to E7 and C1 to C7 were each measured by a fatigue ductility tester.

Each of the electrodeposited copper foils of Examples and Comparative Examples was cut into a thin strip-shaped test sample with 200 mm at the machine direction ("MD"). Subsequently, the thin strip-shaped test sample was attached to a sample holder hung with a weight by using an adhesive tape so that the thin strip-shaped test sample did not slip from the sample holder. Then, the center of the test sample was rapidly vibrated up and down by using a mandrel with a set diameter. The fatigue ductility tester was used to count how many times of vibration while the surface of the test sample had a fracture, and the analysis results were listed in Table 3; furthermore, the ratio of the fatigue life of each electrodeposited foil to the thickness of the electrodeposited copper foil was calculated, and the ratios were also listed in Table 3. In addition, the relevant test conditions were as follows.

1. Fatigue ductility tester: Model 3FDF (purchased from Jovil Universal Manufacturing Company);
2. Size of test sample: 200 mm in length and 12.7 mm in width;
3. Diameter of mandrel: 0.8 mm;
4. Vibration frequency: 100 vibrations per minute;
5. Loading of tension: 84.6 g.

TABLE 3

| Example No. | Average Thickness (μm) | Fatigue Life (times) | Ratio of Fatigue Life to Thickness (times/μm) |
| --- | --- | --- | --- |
| E1 | 6.0 | 243 | 40 |
| E2 | 6.0 | 51 | 8 |
| E3 | 6.0 | 157 | 26 |
| E4 | 6.0 | 163 | 27 |
| E5 | 6.0 | 188 | 31 |
| E6 | 2.9 | 109 | 38 |
| E7 | 21.0 | 789 | 38 |
| C1 | 6.0 | 29 | 5 |
| C2 | 6.0 | 15 | 2 |
| C3 | 6.0 | 12 | 2 |
| C4 | 6.0 | 145 | 24 |
| C5 | 6.0 | 10 | 2 |
| C6 | 6.0 | 19 | 3 |
| C7 | 6.0 | 21 | 4 |

<Electrodes for a Lithium-Ion Secondary Battery>

Examples 1-A to 7-A and Comparative Examples 1-A to 7-A: Electrodes

A negative electrode slurry was coated on the two opposite outermost surfaces (i.e. the drum side and the deposited side) of each of the electrodeposited copper foils of E1 to E7 and C1 to C7 respectively. After a completion of drying, the coated electrodeposited copper foils were then pressed by a pressing machine to obtain negative electrodes for a lithium-ion secondary battery, which were electrodes of Examples 1-A to 7-A and Comparative Examples 1-A to 7-A. Wherein, the negative electrode slurry was composed of 100 parts by weight of a negative electrode active material and 60 parts by weight of 1-Methyl-2-pyrrolidone ("NMP"). The composition of the negative electrode active material and the concerned manufacturing parameters were listed below.

1. The composition of the negative electrode active material:
   (1) Mesophase graphite powder ("MGP"): 93.9 wt %;
   (2) Conductive additive: 1 wt % of conductive carbon black (Super P®);
   (3) Solvent-based binder: 5 wt % of poly-1,1-difluoroethene (PVDF 6020);
   (4) Oxalic acid: 0.1 wt %.
2. The manufacturing parameters:
   (1) Coating speed: 5 meters per minute (m/min);
   (2) Coating thickness: 200 μm;
   (3) Drying temperature: 160° C.;
   (4) Material, size and hardness of a roller of the pressing machine: high-carbon chrome bearing steel (SUJ2); 250 mm×250 mm; 62 to 65 HRC;
   (5) Speed and pressure: 1 m/min; 3000 pound per square inch (psi).

Analysis 5: Wet Adhesion Test

Each electrode was cut into a test sample with a set size and immersed in a specific electrolyte solution during a particular period. If the negative electrode material was delaminated from the electrodeposited copper foil or swollen on the electrodeposited copper foil, it was considered that the adhesive strength between the electrodeposited copper foil and negative electrode material was poor, which was evaluated as "fail." On the contrary, if there was no delamination or swelling, it was evaluated as "pass." In addition, the relevant test conditions were as follows.

1. Test sample size: 100 mm×100 mm;
2. Electrolyte solution: Model: LBC322-01H, manufactured by Shenzhen Capchem Technology Co, Ltd.;
3. Immersing temperature and time: 60° C. and 4 hours.

The analytical results of the electrodes for a lithium-ion secondary battery of Examples 1-A to 7-A (respectively comprising the electrodeposited copper foils of E1 to E7) and Comparative Examples 1-A to 7-A (respectively comprising the electrodeposited copper foils of C1 to C7) were listed in Table 4.

Analysis 6: Wrinkle Test of the Electrodeposited Copper Foil which was Comprised in the Electrode Since the electrodes for a lithium-ion secondary battery of Examples 1-A to 7-A and Comparative Examples 6-A and 7-A passed the wet adhesion test, it showed that the concerned electrodeposited copper foils and the negative electrode active material of the electrodes had a certain adhesive strength, which can ensure that the negative electrode active material would not peel off during the coating process, so the respective electrodeposited copper foils contained in the electrodes were further subjected to a wrinkle test. Accordingly, other test samples of the electrodeposited copper foils of E1 to E7, C6 and C7 were taken. Then, the negative electrode slurry was coated on both surfaces of the test samples and dried directly. After that, the aforementioned sample respectively placed between two horizontal fixed rollers with a distance of 700 mm. Then, the surface of the test samples respectively was visually observed for wrinkles when the test samples were applied a tension of 10 kg. If there was no wrinkle on the surface, it was evaluated as "pass"; however, if there was any wrinkle on the surface, it was evaluated as "fail." The analytical results were listed in Table 4. In addition, the relevant test conditions were as follows.

1. Coating thickness of the negative electrode slurry: 200 μm;
2. Drying temperature: 160° C.

<Lithium-Ion Secondary Battery>

Examples 1-B to 7-B and Comparative Examples 1-B to 7-B: Lithium-Ion Secondary Batteries The negative electrodes of the foregoing Examples 1-A to 7-A and Comparative Examples 1-A to 7-A can be further matched with the positive electrodes to form lithium-ion secondary batteries of Examples 1-B to 7-B and Comparative Examples 1-B to 7-B.

Specifically, the positive electrode of the lithium-ion secondary battery could be prepared roughly through the following steps.

A positive electrode slurry was coated on an aluminum foil. After the contained solvent evaporated, the coated aluminum foil was pressed by a pressing machine to obtain the positive electrode. Wherein, the positive electrode slurry was composed of 100 parts by weight of a positive electrode active material and 195 parts by weight of NMP. The composition of the positive electrode active material was listed below.

1. Positive electrode active substance: lithium cobalt(III) oxide ($LiCoO_2$): 89 wt %;
2. Conductive additives:
    (1) Flaked graphite (KS6): 5 wt %;
    (2) Conductive carbon black (Super P®): 1 wt %;
3. Solvent-based binder: poly-1,1-difluoroethene (PVDF 1300): 5 wt %.

Subsequently, the positive and negative electrodes were cut to a specific size, and then the positive and negative electrodes are alternately stacked with microporous separators (Model: Celgard 2400, manufactured by Celgard Company) sandwiched therebetween, and placed in a press mold filled with an electrolyte solution (Model: LBC322-01H, purchased from Shenzhen Capchem Technology Co, Ltd.), and then sealed to form a laminated type lithium-ion secondary battery. The size of the laminated type lithium-ion secondary battery was 41 mm×34 mm×53 mm.

Analysis 7: Cycle Life Test

The lithium-ion secondary batteries of the Examples 1-B to 7-B and Comparative Examples 1-B to 7-B, as the test samples, were subjected to charge-discharge cycle tests. The specific test conditions of the charge-discharge cycle test were as follows.

1. Charging mode: constant current-constant voltage ("CCCV");
    (1) Charging voltage: 4.2 Volts ("V");
    (2) Charging current: 5 C;
2. Discharging mode: constant current mode ("CC");
    (1) Discharging voltage: 2.8 V;
    (2) Discharging current: 5 C;
    (3) Test temperature: about 55° C.

The cycle life was defined as the times of the charge-discharge cycles the lithium-ion secondary battery under the test can undergo when its capacity fell to 80% of its initial capacity. The cycle life analytical results of the lithium-ion secondary batteries of Examples 1-B to 7-B (respectively comprising the electrodeposited copper foils of E1 to E7) and Comparative Examples 1-B to 7-B (respectively comprising the electrodeposited copper foils of C1 to C7) were also listed in Table 4.

TABLE 4

| Electrodeposited Copper Foil No. | Electrode No. | Wet Adhesion Test | Wrinkle Test | Lithium-Ion Secondary Battery No. | Cycle Life (times) |
|---|---|---|---|---|---|
| Example 1 | Example 1-A | Pass | Pass | Example 1-B | 1330 |
| Example 2 | Example 2-A | Pass | Pass | Example 2-B | 819 |
| Example 3 | Example 3-A | Pass | Pass | Example 3-B | 1247 |
| Example 4 | Example 4-A | Pass | Pass | Example 4-B | 953 |
| Example 5 | Example 5-A | Pass | Pass | Example 5-B | 1352 |
| Example 6 | Example 6-A | Pass | Pass | Example 6-B | 1342 |
| Example 7 | Example 7-A | Pass | Pass | Example 7-B | 1325 |
| Comparative Example 1 | Comparative Example 1-A | Fail | — | Comparative Example 1-B | 695 |
| Comparative Example 2 | Comparative Example 2-A | Fail | — | Comparative Example 2-B | 702 |
| Comparative Example 3 | Comparative Example 3-A | Fail | — | Comparative Example 3-B | 647 |
| Comparative Example 4 | Comparative Example 4-A | Fail | — | Comparative Example 4-B | 685 |
| Comparative Example 5 | Comparative Example 5-A | Fail | — | Comparative Example 5-B | 694 |
| Comparative Example 6 | Comparative Example 6-A | Pass | Fail | Comparative Example 6-B | 764 |
| Comparative Example 7 | Comparative Example 7-A | Pass | Fail | Comparative Example 7-B | 739 |

(Discussion of Experimental Results)

From the results of Tables 2 to 4, since the electrodeposited copper foils of E1 to E7 have at least one of the drum side and the deposited side with a Vv in an appropriate range (i.e. Vv is in the range of 0.17 $\mu m^3/\mu m^2$ to 1.17 $\mu m^3/\mu m^2$) and control a $\Delta Sz$ in an appropriate range (i.e. $\Delta Sz$ is smaller than 0.60 μm), the electrodeposited copper foils of E1 to E7 not only have good mechanical properties of achieving 50 and above times in the fatigue life test; more importantly, in the electrodes of Examples 1-A to 7-A, the drum side and the deposited side of the electrodeposited copper foil can have sufficient adhesion strength to the negative electrode active material, thereby passing the wet adhesion test, in addition to passing the wrinkle test. Moreover, the charge-discharge cycle life of the lithium-ion secondary batteries of Examples 1-B to 7-B can reach 800 and above times. It demonstrated that the electrodeposited copper foil of the instant disclosure indeed has improved mechanical properties and excellent anti-wrinkle properties, thereby reducing or even avoiding the occurrence of wrinkles and fractures of the electrodeposited copper foil.

Referring to the electrodeposited copper foils of C1 to C7, since the drum side and the deposited side, for which the above-mentioned two characteristics were not controlled at the same time, the analytical results of the fatigue life for the electrodeposited copper foils of C1 to C7 were all worse. Besides, from the result that the electrodes of Comparative Examples 1-A to 5-A failed the wet adhesion test, it can be seen that the Vv of the at least one of the drum side and the deposited side of the electrodeposited copper foils was not controlled within the appropriate range, so the at least one of the drum side and the deposited side of the electrodeposited copper foils did not have enough adhesion strength to the negative electrode active material in the electrodes of Comparative Examples 1-A to 5-A. In addition, even though the electrodes of Comparative Examples 6-A and 7-A passed the wet adhesion test, there was still an occurrence of wrinkles. Accordingly, all the cycle lives of the lithium-ion secondary batteries of Comparative Examples 1-B to 7-B were less than 800 times, whose cycle life performances were significantly inferior to those of the lithium-ion secondary batteries of Examples 1-B to 7-B.

Further analyzing the characteristics of the electrodeposited copper foils of C1 to C7, it shows that since the Vv of the at least one of the drum side and the deposited side of the electrodeposited copper foils of C6 and C7 respectively was controlled in the appropriate range but ΔSzs of the electrodeposited copper foils of C6 and C7 were not controlled within the appropriate range, the electrodeposited copper foils of C6 and C7 failed to pass the wrinkle test, and the cycle lives of the lithium-ion secondary batteries of Comparative Examples 6-B and 7-B containing the electrodeposited copper foils of C6 and C7 still did not achieve 800 times. The lithium-ion secondary batteries of Comparative Examples 6-B and 7-B still respectively had a poor cycle life. Based on the above results, it can be seen that if the Vv of one of the outermost surfaces of the electrodeposited copper foil (that is, the drum side or the deposited side) and the ΔSz of the both outermost surfaces are not simultaneously controlled within an appropriate range, when the electrodeposited copper foil is applied to a lithium-ion secondary battery, its cycle life cannot be extended.

In addition, from the experimental results of Examples 1, 6 and 7, it can be seen that in the instant disclosure, either the electrodeposited copper foil of Example 6 with a thinner thickness (2.9 μm), the electrodeposited copper foil of Example 1 with a general thickness (6.0 μm) or the electrodeposited copper foil of Example 7 with a thicker thickness (21.0 μm), all three kinds of the electrodeposited copper foils can obtain the same good bending resistance. It demonstrated that the technical means of the instant disclosure indeed improve the processability and durability of electrodeposited copper foil. When the electrodeposited copper foils are prepared under the same conditions, the ratios of the fatigue life to the thickness are almost the same, which means that all electrodeposited copper foils with different thicknesses can extend their fatigue life through the technical means of the instant disclosure. Especially for the thinner electrodeposited copper foil, the traditional thinner electrodeposited copper foil mostly has the problem of poor fatigue life. However, the ratio of the fatigue life of the electrodeposited copper foil to the thickness of the electrodeposited copper foil of Example 6 was roughly the same as the ratio of the fatigue life to the thickness of the electrodeposited copper foil of Examples 1 and 7. Therefore, it can be seen that the instant disclosure has a stronger effect of extending the fatigue life of the thin electrodeposited copper foil.

In summary, the instant disclosure simultaneously adjusts the surface texture characteristics (i.e. Vv) of the drum side and/or the deposited side of the electrodeposited copper foil and controls the profile characteristics of the drum side and the deposited side (i.e. ΔSz), the mechanical strength of the electrodeposited copper foil can be specifically enhanced and the adhesion strength between the electrodeposited copper foil and the active material can also be enhanced, thereby realizing an improvement in prolonging the charge-discharge cycle life of the lithium-ion secondary battery and improving the performance of the battery.

The above-mentioned embodiments are merely examples for the convenience of description, but these embodiments are not used to limit the scope of the claims of the instant disclosure. All other changes or modifications completed without departing from the content of this disclosure should all be included in the scope of claims covered by this disclosure.

What is claimed is:

1. An electrodeposited copper foil comprising a drum side and a deposited side opposing the drum side, wherein at least one of the drum side and the deposited side exhibits a void volume (Vv) in the range of 0.17 $\mu m^3/\mu m^2$ to 1.17 $\mu m^3/\mu m^2$; and an absolute value of a difference between a maximum height (Sz) of the drum side and a Sz of the deposited side is in the range of less than 0.60 μm; wherein a void volume is obtained according to Standard Method ISO 25178-2:2012; the Vv refers to a void volume at a material ratio of 10%; the Sz is obtained according to Standard Method ISO 25178-2:2012.

2. The electrodeposited copper foil of claim 1, wherein the drum side exhibits a Vv in the range of 0.17 $\mu m^3/\mu m^2$ to 1.17 $\mu m^3/\mu m^2$ and the deposited side exhibits a Vv in the range of 0.17 $\mu m^3/\mu m^2$ to 1.17 $\mu m^3/\mu m^2$.

3. The electrodeposited copper foil of claim 1, wherein at least one of the drum side and the deposited side exhibits a core void volume (Vvc) in the range of 0.16 $\mu m^3/\mu m^2$ to 1.07 $\mu m^3/\mu m^2$; wherein the Vvc is a difference in void volume between a first material ratio of 10% and a second material ratio of 80%.

4. The electrodeposited copper foil of claim 1, wherein the drum side exhibits a Vvc in the range of 0.16 $\mu m^3/\mu m^2$ to 1.07 $\mu m^3/\mu m^2$ and the deposited side exhibits a Vvc in the range of 0.16 $\mu m^3/\mu m^2$ to 1.07 $\mu m^3/\mu m^2$; wherein the Vvc is a difference in void volume between a first material ratio of 10% and a second material ratio of 80%.

5. The electrodeposited copper foil of claim 1, wherein at least one of the drum side and the deposited side exhibits a dale void volume (Vvv) in the range of 0.01 $\mu m^3/\mu m^2$ to 0.10 $\mu m^3/\mu m^2$; wherein the Vvv refers to a void volume at a material ratio of 80%.

6. The electrodeposited copper foil of claim 1, wherein the drum side exhibits a Vvv in the range of 0.01 $\mu m^3/\mu m^2$ to 0.10 $\mu m^3/\mu m^2$ and the deposited side exhibits a Vvv in the range of 0.01 $\mu m^3/\mu m^2$ to 0.10 $\mu m^3/\mu m^2$; wherein the Vvv refers to a void volume at a material ratio of 80%.

7. The electrodeposited copper foil of claim 4, wherein the drum side exhibits a Vvv in the range of 0.01 $\mu m^3/\mu m^2$ to 0.10 $\mu m^3/\mu m^2$ and the deposited side exhibits a Vvv in the range of 0.01 $\mu m^3/\mu m^2$ to 0.10 $\mu m^3/\mu m^2$; wherein the Vvv refers to a void volume at a material ratio of 80%.

8. The electrodeposited copper foil of claim 1, wherein at least one of the drum side and the deposited side exhibits a Sz in the range of 1.24 μm to 3.25 μm.

9. The electrodeposited copper foil of claim 1, wherein the drum side exhibits a Sz in the range of 1.24 μm to 3.25 μm and the deposited side exhibits a Sz in the range of 1.24 μm to 3.25 μm.

10. The electrodeposited copper foil of claim 1, wherein the electrodeposited copper foil has a thickness in the range of 2 µm to 25 µm.

11. The electrodeposited copper foil of claim 1, wherein the electrodeposited copper foil exhibits a ratio of a fatigue life of the electrodeposited copper foil to a thickness of the electrodeposited copper foil in the range of more than 5 times/µm.

12. The electrodeposited copper foil of claim 11, wherein the ratio of a fatigue life of the electrodeposited copper foil to a thickness of the electrodeposited copper foil is in the range of 8 times/µm to 40 times/µm.

13. The electrodeposited copper foil of claim 1, wherein the electrodeposited copper foil comprises a bare copper foil and a surface-treated layer disposed on the bare copper foil; the drum side and the deposited side are respectively on both outermost surfaces of the electrodeposited copper foil, and an outermost surface of the surface-treated layer is the drum side or the deposited side.

14. The electrodeposited copper foil of claim 13, wherein the surface-treated layer is at least one selected from the group consisting of: a zinc-chromium layer, a chromium layer, and an organic layer.

15. An electrode for a lithium-ion secondary battery comprising the electrodeposited copper foil of claim 1, at least one binder and at least one active substance.

16. The electrode for a lithium-ion secondary battery of claim 15, wherein the binder and the active substance are in contact with the deposited side of the electrodeposited copper foil.

17. The electrode for a lithium-ion secondary battery of claim 15, wherein the binder and the active substance are in contact with the drum side of the electrodeposited copper foil.

18. A lithium-ion secondary battery comprising the electrode for a lithium-ion secondary battery of claim 15.

* * * * *